United States Patent [19]

Vance

[11] Patent Number: 4,480,327
[45] Date of Patent: Oct. 30, 1984

[54] SINGLE CHANNEL DUPLEX COMMUNICATION SYSTEM

[75] Inventor: Ian A. W. Vance, Newport, England

[73] Assignee: International Standard Electric Corporation, New York, N.Y.

[21] Appl. No.: 559,167

[22] Filed: Dec. 7, 1983

Related U.S. Application Data

[63] Continuation of Ser. No. 292,097, Aug. 12, 1981.

[30] Foreign Application Priority Data

Aug. 26, 1980 [GB] United Kingdom ............... 8027566

[51] Int. Cl.³ .............................................. H04L 5/14
[52] U.S. Cl. ......................................... 370/27; 370/38
[58] Field of Search ....................... 370/27, 38, 24, 32; 328/158

[56] References Cited

U.S. PATENT DOCUMENTS

| | | | |
|---|---|---|---|
| Re. 30,111 | 10/1979 | Blood | 370/27 |
| 3,899,637 | 8/1975 | Willard et al. | 370/27 |
| 4,237,463 | 12/1980 | Bjor et al. | 370/27 |
| 4,238,850 | 12/1980 | Vance | 370/27 |
| 4,271,501 | 6/1981 | Vance et al. | 370/38 |
| 4,320,498 | 3/1982 | Justice | 370/27 |
| 4,393,494 | 7/1983 | Belforte et al. | 370/27 |

Primary Examiner—Douglas W. Olms
Attorney, Agent, or Firm—John T. O'Halloran; Peter R. Ruzek

[57] ABSTRACT

A single channel duplex transmitter/receiver utilizing digital frequency shift keying (FSK) signals. An analogue-to-digital converter frequency modulates the output of a local oscillator whose output is coupled via a mixer/combiner/splitter network to an aerial. FSK signals received from the aerial in the receiver are mixed with the local oscillator output in network to provide quadrature signals which are low-pass filtered before being demodulated in a zero IF demodulator to give a digital output. To avoid unwanted sidetone the output of the A/D converter is fed through a delay to a digital network where it is subtracted from the corresponding signals fed back through the demodulator. The digital signals are then fed to a D/A converter.

12 Claims, 5 Drawing Figures

SINGLE CHANNEL DUPLEX COMMUNICATION SYSTEM

This application is a continuation of application Ser. No. 292,097, filed Aug. 12, 1981.

BACKGROUND OF THE INVENTION

Many communication systems, especially those connected with the switched telephone network, require a full duplex link. This has traditionally presented problems when a radio link is needed. Solutions either require frequency division of the two paths together with duplexing filters for "2 to 4 wire" splitting, or TDM which can only be easily implemented in systems which are already digital.

U.S. Pat. No. 4,238,850 issued Dec. 9, 1980 discloses a transmitter/receiver equipment for a single channel duplex communication system incuding a local oscillator means the frequency of which is the center frequency of the single channel signals, means for frequency modulating the local oscillator with first audio frequency signal, first and second means for directionally combining the local oscillator output in phase quadrature with audio frequency modulated signals received from the single channel whereby a major portion of the local oscillator output is transmitted from each combining means to the single channel and a minor portion of the local oscillator output together with the received signals is applied from each combining means to first and second mixing means.

This apparatus further includes, respectively, means for low pass filtering each of the mixed outputs of the first and second mixing means, means for amplifying each of the outputs of the low pass filtering means to a constant level, means for differentiating each of the outputs of the amplifying means, means for multiplying the output of each differentiating means with the input to the other differentiating means, means for subtracting one of the multiplier outputs from the other to provide the demodulated second audio frequency signal, means for subtracting a proportion of the first audio frequency signal from the demodulated signal and means for feeding the output of the local oscillator in combination with a phase quadrature output of the local oscillator to an aerial via which the signals frequency modulated with the second audio frequency are received.

In such equipment the receiver portion makes use of a so-called "zero IF" or "direct conversion" method of demodulation. Such a method is described in British patent specification No. 1,530,602—Vance—1. Briefly, local oscillator signals in phase quadrature at the carrier frequency are each separately mixed with the incoming audio modulated signal. The resulting signals have zero IF with the two sidebands folded over on each other at the baseband and extending in frequency from DC to the single sideband width of the original signal. The mixer outputs are low pass filtered and then amplified to a standard level. After amplification the two signals are separately differentiated. Each differentiated signal is then multiplied by the input to the other differentiator and one of the multiplier outputs is subtracted from the other.

SUMMARY OF THE INVENTION

This invention relates to a single channel duplex radio system, and more particularly to portable radio transmitter/receiver equipments.

The present invention provides full duplex operation for a single channel radio transmitter/receiver where the radio signals are transmitted in digital form. A particularly attractive form of digital modulation for radio signals is that known as frequency shift keying (FSK).

According to the present invention there is provided a transmitter/receiver equipment for a digital single channel duplex communication system wherein transmission is effected by way of frequency shift keyed (FSK) digital signals, the transmitter portion including a source of digital signals, a local oscillator capable of being modulated by said digital signals to produce FSK signals, means for coupling the local oscillator FSK signals to a transmission medium, means for mixing FSK signals received from the transmission medium with the local oscillator output to produce quadrature output signals, zero IF demodulation means to which said quadrature outputs are applied to produce a digital output signal, and delay means to which the digital signals from the source are applied, the delayed digital signals being applied to a digital network wherein cancellation with corresponding digital signals from a splitter/combiner network is effected.

BRIEF DESCRIPTION OF THE DRAWINGS

Embodiments of the invention will now be described, with reference to the accompanying drawings, in which.

DETAILED DESCRIPTION

Figure 1:
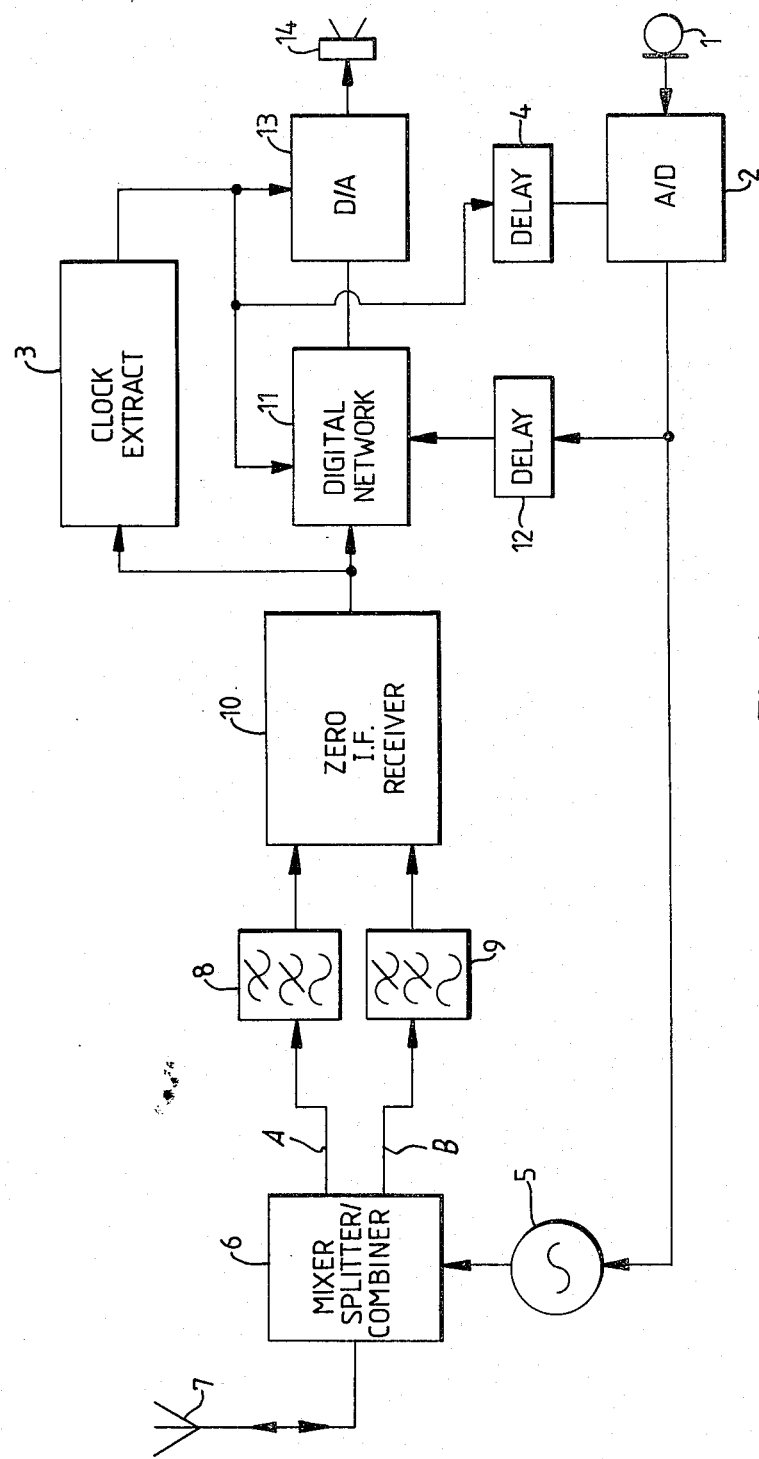
FIG. 1 is a block diagram of a transmitter/receiver arrangement according to the present invention.

In the transmitter/receiver shown in FIG. 1, a microphone 1 feeds an analogue-to-digital coverter 2 which operates under the control of clock signals from a clock extraction circuit 3 via a delay network 4. The digital output of converter 2 is used to frequency modulate a local oscillator 5 the output of which is FSK signals. These FSK signals are fed, via a mixer network 6, to aerial 7. In the receive mode FSK signals from the aerial 7 are mixed with the output of local oscillator 5 in such a way as to produce quadrature outputs A and B. The outputs A and B are fed through respective low pass filters 8, 9 to a zero IF receiver 10, wherein the two signals are amplified, differentiated, multiplied each by the other and the resultant outputs subtracted one from the other in the manner disclosed in U.S. Pat. No. 4,238,850, or by other zero IF receiver means.

The digital output from receiver 10 is then fed to a digital decoder network 11. This network 11 also receives via a delay 12 an output from the A/D converter 2. The function of the digital network is to cancel by subtraction from the output of receiver 10 the proportion of the transmitted signals which would otherwise cause an unwanted sidetone in the audio output. The digital output of digital network 11 is then converted to audio signals in the D/A converter 13 and fed to the transducer 14. A/D converter 13 is also controlled by clock signals from the clock extraction circuit 3, which extracts the requisite clock signals from the output of receiver 10.

Figure 5:
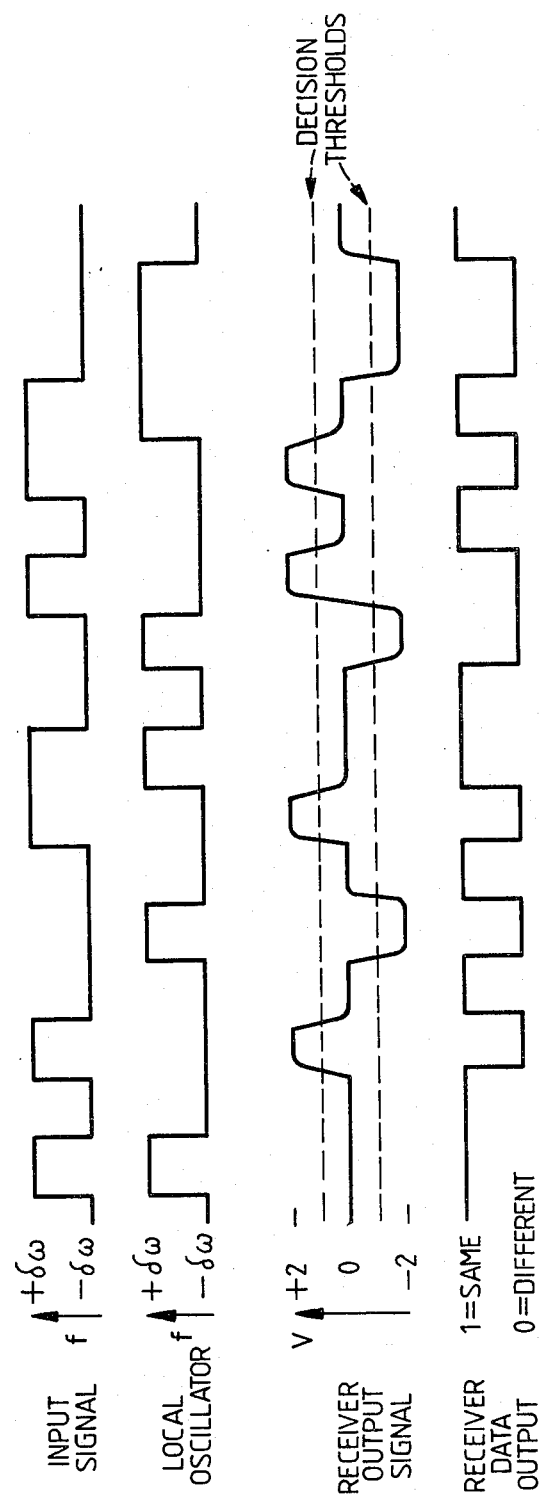
FIG. 5 illustrates various waveforms occuring in the transmitter/receiver of FIG. 1 or FIG. 3.

If the input signals from aerial 7 are frequency shift modulated and the combination of the mixer network, which acts also as a splitter/combiner network, with the main receiver 10 is a frequency discriminator, the FSK input will be demodulated to give a digital output which is a replica of that modulating the distant transmitter. The local oscillator is also FSK modulated with digital data which is at the same bit rate as that received from the distant transmitter by virtue of being synchronized from the incoming data. Thus, both signals present at the mixer 6 are FSK modulated at the same nominal bit rate and the same nominal frequency deviation ($\delta\omega$). It is evident then that the difference frequency between them as passed by the low-pass filter can be either zero or twice the individual deviation, (i.e. $2\delta\omega$) and furthermore, that in this last case there are two possibilities, i.e., the input being high or low of the local oscillator frequency (i.e.$\pm 2\delta\omega$). The output from the receiver is thus a three-level signal as shown in FIG. 5. This is detected with reference to two thresholds as shown and decoded to one digital data line which indicates merely whether the input digit to the antenna in each bit period was the same as that modulating the local oscillator or different. The digital network 10 then combines this information with the local modulation and outputs the true received binary digits. The local oscillator output is transmitted from the antenna and thus the local oscillator forms the transmitter. A similar equipment at the distant end complete the two-way link. While the system as described will operate without the two bit streams being synchronous, it would require a greater bandwidth to do so as the output from the mixer stages could then contain variable length pulses. In order to obtain bit synchronization it is necessary to employ the delay 4 in the clock to the transmitter to equalize for the delay through the main receiver path and similarly, to delay the transmitter data in a delay circuit 12 before the digital substraction network.

Figure 2:
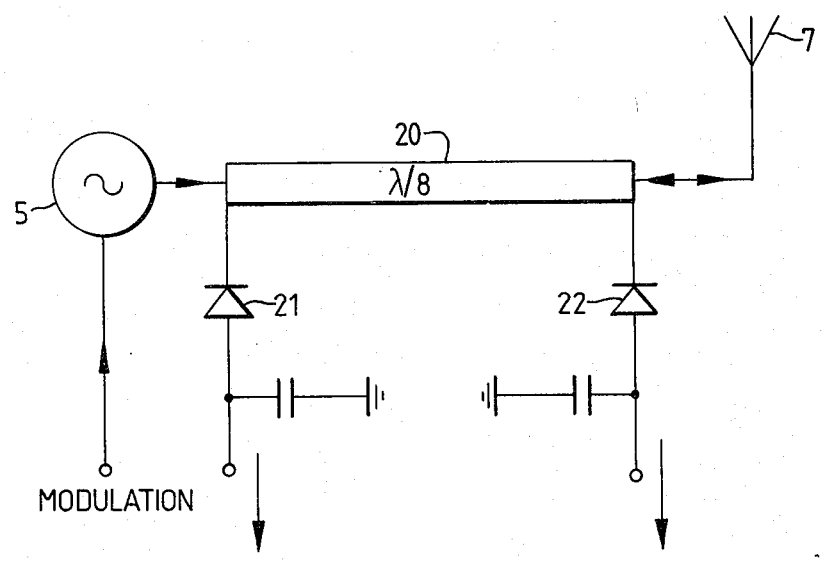
FIG. 2 is a diagram of a splitter/combiner network suitable for the transmitter/receiver of FIG. 1.

The mixer/splitter/combiner network 6 of FIG. 1 is conveniently realized by the arrangement of FIG. 2. A length 20 of transmission line ⅛ wavelength electrical length at the carrier frequency is provided with a diode detector 21, 22 connected thereto at each end. The local oscillator 5, which is frequency modulated in the transmit mode, is connected to one end of the transmission line and the antenna 7 to the other end. Signals from the antenna, in the receive mode, mix with the oscillator output and the difference frequency output signals at each detector will be in quadrature, suitable for subsequent processing after low pass filtering in the direct conversion (zero IF) receiver circuit 10. In the transmit mode the frequency modulated local oscillator signals are transmitted from the antenna.

Figure 3:
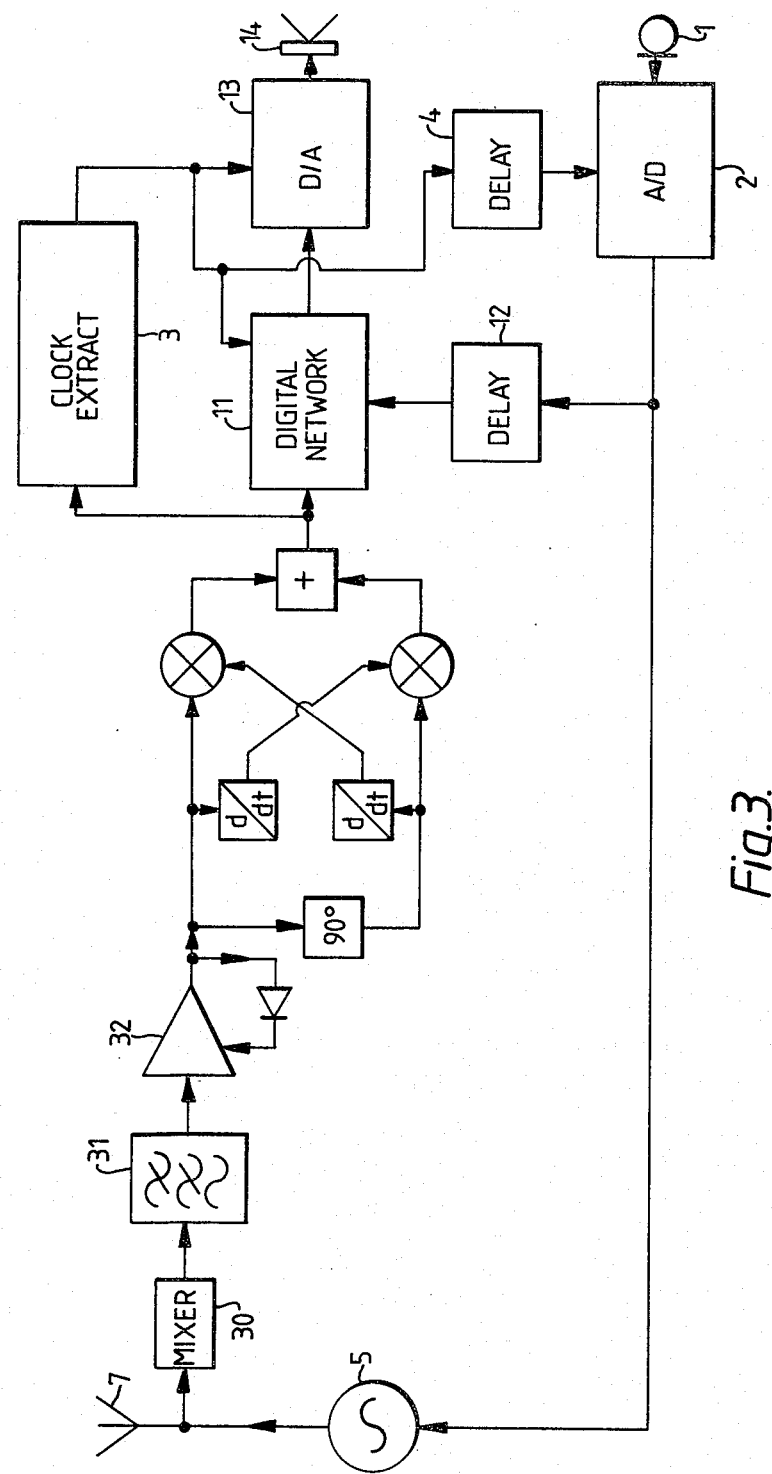
FIG. 3 shows an alternative transmitter/receiver arrangement to that of FIG. 1.

In an alternative transmitter/receiver arrangement shown in FIG. 3 the mixer network 30 does not effect any splitting/combining of the r.f. signals. It serves only to mix the received signals with the local oscillator output. The mixer output (which will still include a feedback of the local transmitter signals) is fed through a low-pass filter 31 to an automatic levelling amplifier 32. The levelled signals are then fed in quadrature to differentiating, multiplying and subtraction circuits as before. The remainder of the transmitter/receiver is the same as in FIG. 1.

Figure 4:
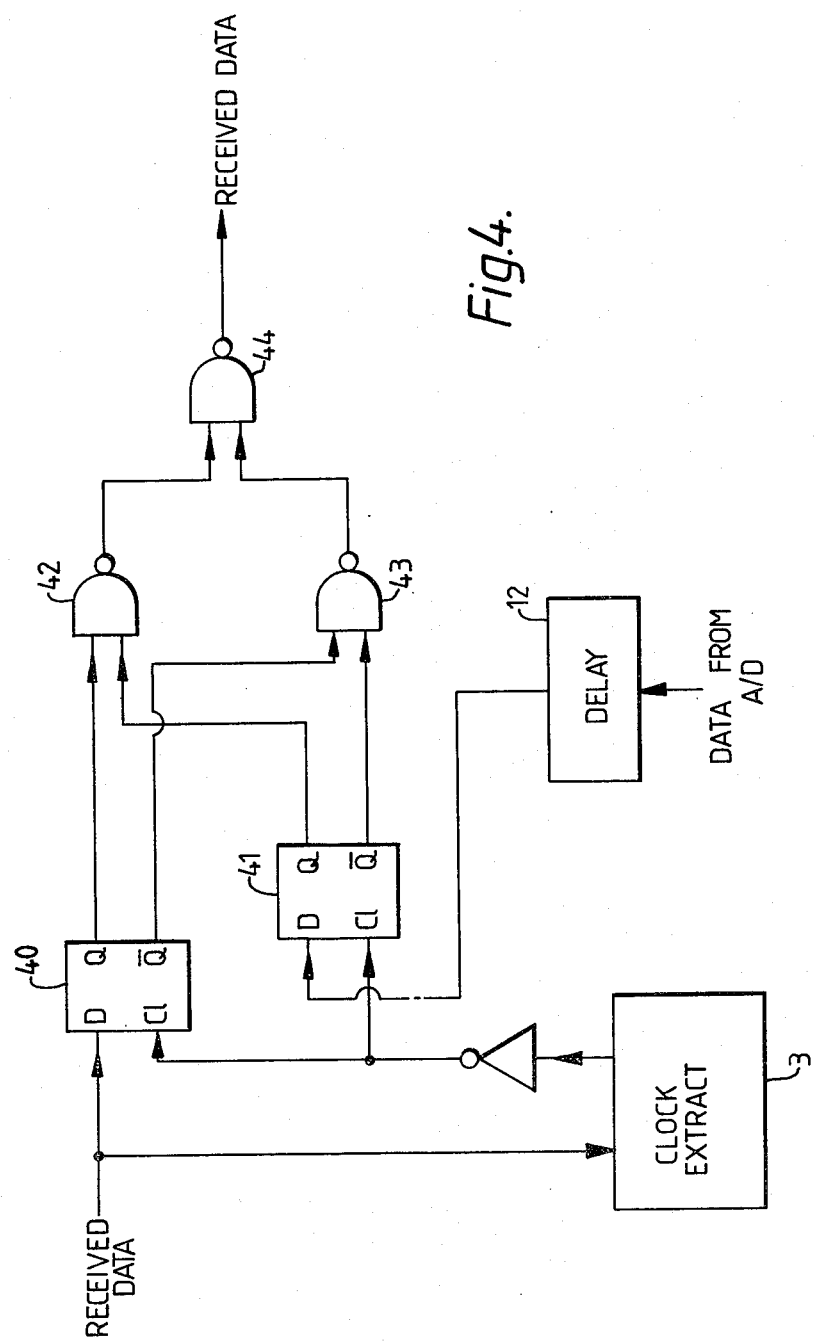
FIG. 4 shows a digital network for use in the arrangements of FIG. 1 or FIG. 3.

FIG. 4 shows details of a digital network 11 for use in the arrangement of FIG. 1 or FIG. 3. The digital signal from receiver 10 is applied to the D input of a first D-type flip-flop 40 together with clock pulses from the clock extraction circuit 3 applied to the CLOCK input. Similarly the local transmitter digital signals from A/D converter 2 are applied via delay 12 to the D input of a second D-type flip-flop 41 together with the clock pulses from circuit 3 applied to the CLOCK input thereof. The Q outputs of flip-flops 40 and 41 are applied to a first NAND gate 42 while the $\bar{Q}$ outputs of flip-flops 40 and 41 are applied to a second NAND gate 43. Finally, the outputs of NAND gates 42 and 43 are applied to a third NAND gate 44. Thus, assuming the delay of delay circuit 12 matches the loop delay via local oscillator 5, mixer 6, filters 8, 9 and receiver 10, there will be no sidetone in the output from NAND gate 44.

It is to be noted that the invention is not limited to radio transmission. The antenna can be replaced by a feed to a cable. Also the local oscillator may have a premodulation filter such that the digital transitions are not instantaneous. The oscillator can be modulated in a return-to-zero format, in which case some modification of the receiver and digital network circuitry would be required. Preamplifers after the mixer and before the filters can be included to improve the signal-to-noise ratio of the system. Finally, although the invention has been described in terms of audio frequency input, and output, in which case the audio frequencies are converted to and from digital signals, there may be provision for inserting and extracting digital data signals, such as may be used for instance for signalling and/or supervisory services.

I claim:

1. A transmitter/receiver system fir a digital single channel duplex communication system wherein transmission through a transmission medium is effected by way of frequency shift keyed (FSK) signals, comprising transmit/receive means for transmitting outgoing FSK signals into and receiving incoming FSK signals from the transmission medium; a transmitter portion including a source of digital message signals representative of the message to be transmitted, a local oscillator capable of being modulated by digital signals to produce FSK signals, means for supplying said digital message signals to said local oscillator to modulate the latter with said digital message signals for producing said outgoing FSK signals, means for applying said outgoing FSK signals from said local oscillator to said transmit/receive means for transmission into the transmission medium; and a receiver portion including means for generating quadrature ouput signals by mixing said incoming FSK signals as received by said transmit/receive means from the transmission medium with said outgoing FSK signals as produced by said local oscillator, zero IF demodulation means connected to said generating means and operative for producing a digital output signal from said quadrature output signals, delay means for delaying said digital message signals from said source to obtain delayed digital signals, and means for cancelling the contribution of said outgoing FSK signals to said digital output signal of said zero IF demodulation means, including a digital decoding network connected to said zero IF demodulation means to receive said digital output signal therefrom, and to said delay means to receive said delayed digital signals therefrom.

2. A system according to claim 1, wherein said generating means includes a length of transmission line which is ⅛ wavelength electrical length at the carrier frequency connected to said transmit/receive means at one of its ends, the local oscillator ouptut being connected to the other end of the transmission line, and separate dioxide detecters connected one to each end of the transmission line to provide the quadrature output signals for the zero IF demodulation means.

3. A system according to claim 2, and further comprising separate low pass filtering means for each detector output.

4. A system according to claim 1, wherein said generating means includes a mixer to which the output of the oscillator and of the transmit/receive means are applied, a low pass filter to which the mixer output is applied, an amplifier having automatic level control to which the filtered mixer output is applied, and means for applying the amplifier output directly and with 90° phase shift to the zero IF demodulating means.

5. A system according to claim 1, further comprising means for issuing a common clock pulse train synchronized with the digital output signal of said demodulation means, and wherein the digital decoding network comprises first and second D-type flip-flops respectively having a D-input, a clock input, and complementary first and second outputs, the digital output signal of the zero IF demodulation means and the delayed digital signals, being supplied to said D-inputs of respectively one and the other of the two flip-flops, the output of said issuing means being connected to said clock inputs to supply said common clock pulse train thereto, first and second NAND logic gates to which are applied respectively said first and second outputs of the first and second flip-flops, and a third NAND gate to which are applied the outputs of the first and second NAND gates.

6. A system according to claim 1, wherein the source of digital signals is an analogue-to-digital converter and the output of the digital network is applied to a complementary digital-to-analogue converter.

7. A system according to claim 6, and further comprising respective complementary electroacoustic transducers respectively coupled to said converters.

8. A system according to claim 1, wherein said transmit/receive means includes a radio antenna.

9. A system according to claim 5, wherein said issuing means includes means for extracting said common clock pulse train from said digital output signal of said demodulation means.

10. A system according to claim 9, wherein said source of said digital message signals has a clock input; and further comprising means for connecting the output of said extracting means to said clock input of said source to supply said common clock pulse train thereto.

11. A system according to claim 10, wherein said connecting means includes additional delay means for delaying said common clock pulse train prior to reaching said clock input of said source.

12. A system according to claim 1, wherein said generating means includes a splitter/combiner network.

* * * * *